United States Patent [19]
Miyamoto et al.

[11] Patent Number: 5,534,667
[45] Date of Patent: Jul. 9, 1996

[54] PRINTED CIRCUIT BOARD HAVING ZIG-ZAG CONTACT ARRANGEMENT

[75] Inventors: Hidenori Miyamoto, Urayasu; Isao Soshi, Tokyo, both of Japan

[73] Assignee: Nikon Corporation, Tokyo, Japan

[21] Appl. No.: 372,840

[22] Filed: Jan. 13, 1995

Related U.S. Application Data

[63] Continuation of Ser. No. 187,164, Jan. 27, 1994, abandoned.

[30] Foreign Application Priority Data

Jan. 27, 1993 [JP] Japan .................................. 5-031282

[51] Int. Cl.⁶ ...................................... H05K 1/18
[52] U.S. Cl. ........................ 174/261; 361/767; 361/777
[58] Field of Search .................................. 361/767, 777, 361/808; 174/261, 267

[56] References Cited

U.S. PATENT DOCUMENTS

| | | | |
|---|---|---|---|
| 4,484,704 | 11/1984 | Grassauer et al. | 228/180 A |
| 4,772,762 | 9/1988 | Fukino | 174/68.5 |
| 5,021,812 | 6/1991 | Kohno et al. | 354/76 |
| 5,061,190 | 10/1991 | Medeiros et al. | 439/60 |

Primary Examiner—Laura Thomas

[57] ABSTRACT

A printed circuit board having a circuit pattern portion for allowing transmission of electrical signals and a plurality of land pattern portions. The land pattern portions allow the circuit pattern portion to be electrically coupled to circuitry which is operatively coupled to the printed circuit board. Finally, the land pattern portions are arranged in a zig-zag fashion to form a plurality of rows which are disposed on the printed circuit board.

3 Claims, 4 Drawing Sheets

PRINTED CIRCUIT BOARD HAVING ZIG-ZAG CONTACT ARRANGEMENT

This application is a continuation of application Ser. No. 08/187,164, filed Jan. 27, 1994, now abandoned.

BACKGROUND OF THE INVENTION

1. Field of the Invention

The present invention relates to a printed circuit board having a contact or terminal portion which is suitable to be electrically contacted by a probe or pin device or structure.

2. Description of the Related Art

When the establishment of electrical contact among printed wiring or printed circuit boards is necessary, configurations such as depicted in FIGS. 1(a) and 1(b) often are utilized.

Referring now to FIGS. 1(a) and (b), nine land portions 31–39 are formed at the end portion of a printed circuit board 30. Probes 41–49, as shown in FIG. 1(a), respectively contact lands 31–39. Probes 41–49 are probes (e.g., search units) of a device for the inspection of the printed circuit board 30 which is typically carried-out during manufacturing or repairing processes.

The width A of a land portion (e.g., land portion 31) is set so as to permit proper and effective contact with a probe device (e.g., probe 41) of the type mentioned above. The spacing C of the land is set to a necessary distance to accommodate a conductor's width and the pitch of a connector device. Such an arrangement is necessary so that no two conductors of a connector or probe can contact each other to thereby cause a short circuit to occur.

The spacing B between adjacent lands is set such that the interval distance C equals land width A+the spacing B. Accordingly, land space in the case of a set of nine lands 31–39 becomes 8C+A (see FIG. 1(b)) and is set according to the size, precision, and location of probes 41–49 and the corresponding conducting probes.

If the distance between lands is reduced while maintaining the land space of the printed circuit board 30 at spacing B, smaller size probes 41–49 or an increase in the accuracy of their positioning is necessary. However, when using a custom article, such as a miniaturized set of probes 41–49, an increase in their mounting position precision involves a corresponding increase in manufacturing cost.

For an additional discussion of electrical contact systems of the type mentioned above, reference is made to U.S. Pat. No. 5,021,812 to Kohno et al.

SUMMARY OF THE INVENTION

It is an object of the present invention to solve the above-mentioned problems associated with providing electrical contact among numerous printed circuit boards.

It is another object of the present invention to provide a printed circuit board which has a relatively small land space and which is cost effective to manufacture and which does not require an increase in the contact precision of probes or contact pins which are used to form electrical contact with the printed circuit board.

It is still another object of the present invention to provide a printed circuit board which can be miniaturized by decreasing the size of the board's contact area.

Additional objects and advantages of the invention will be set forth in part in the description which follows, and in part, will be obvious from the description, or may learned by practice of the invention.

These and other objects and advantages of the present invention are achieved by providing a printed circuit board that includes a circuit pattern portion for allowing transmission of electrical signals and a plurality of land pattern portions. The land pattern portions allow the circuit pattern portion to be electrically coupled to external circuitry. Moreover, the land pattern portions are arranged in a zig-zag fashion to form a plurality of rows disposed on the printed circuit board.

BRIEF DESCRIPTION OF THE DRAWINGS

The above-mentioned and other objects and advantages of the present invention will become apparent and more readily appreciated from the following description of the preferred embodiments, taken in conjunction with the accompanying drawings, of which.

DETAILED DESCRIPTION OF THE PREFERRED EMBODIMENTS

Figure 1A:
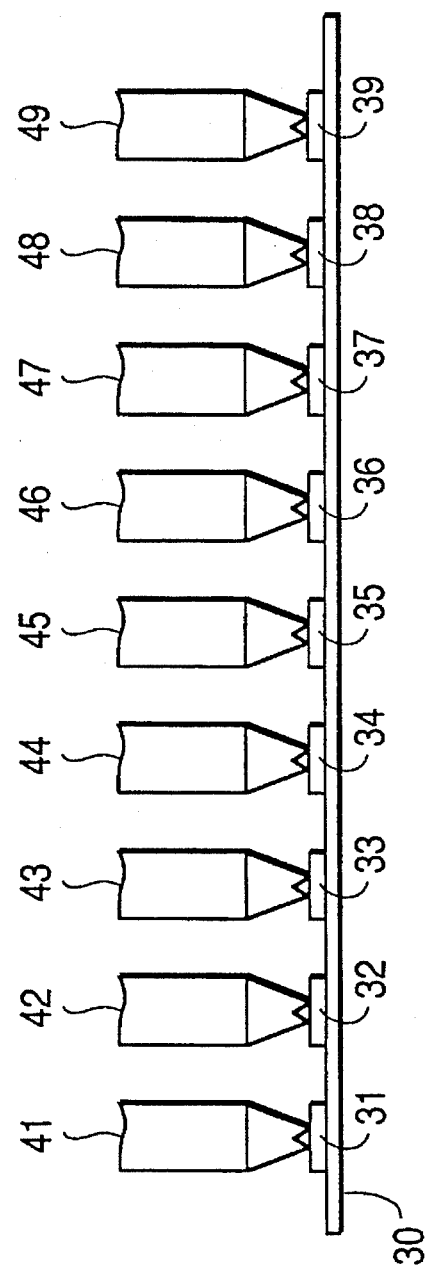
FIGS. 1(a) and 1(b) are elevational views of a typical printed circuit board.

Reference will now be made in detail to the present preferred embodiments of the present invention, examples of which are illustrated in the accompanying drawings, wherein like reference numerals refer to the like elements throughout.

Figure 1B:
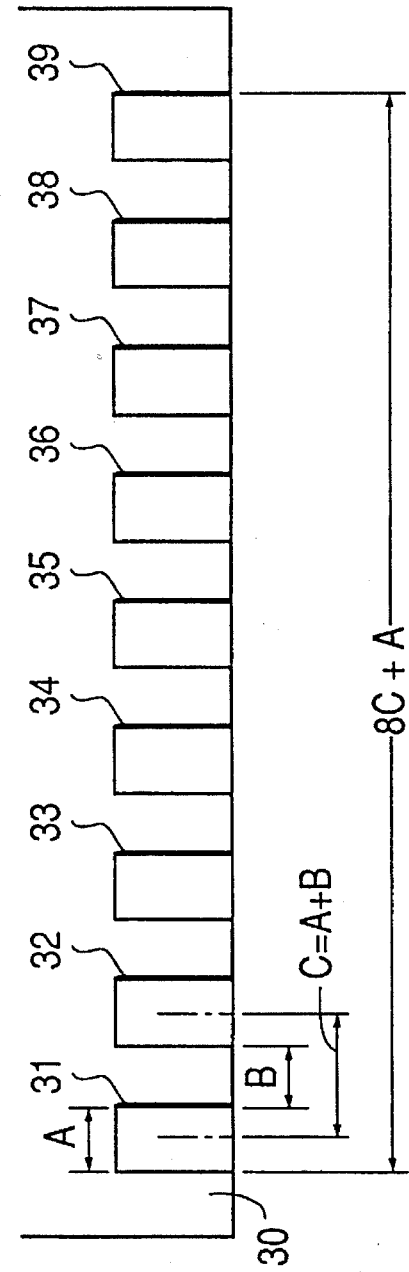
Figure 2A:
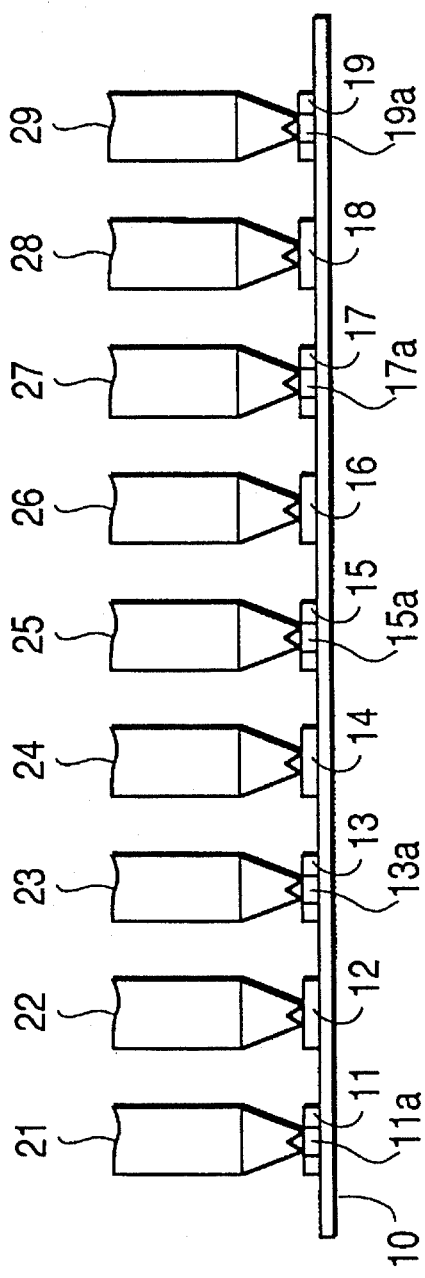
FIGS. 2(a) and 2(b) are respectively elevational and top views of a printed circuit board according to a first embodiment of the present invention.
Figure 2B:
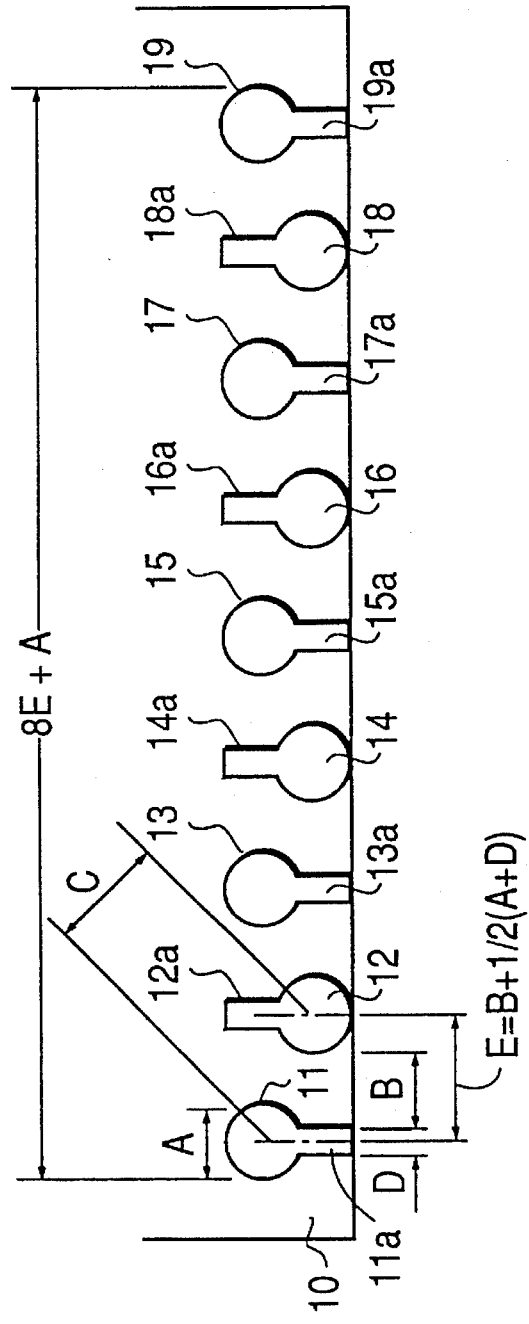

Referring now to FIGS. 2(a) and 2(b), therein depicted are elevational and top views of a printed circuit board according to a first embodiment of the present invention. More particularly, FIG. 2(b) shows nine (9) lands 11–19 which are formed at an end portion of a printed circuit board 10. Probes 21–29 are configured to respectively contact lands 11–19 as shown in FIG. 2(a). Probes 21–29 can be probes (e.g., search units or contact pins) of an inspection device (not shown in the drawing) to inspect the electrical operation of printed circuit board 10 which is typically done during manufacturing or repairing processes. Such probes were discussed above in regard to FIGS. 1(a) and 1(b).

The position of lands 11–19, as shown in the elevational drawing of FIG. 2(a), comprises a front arrangement of lands 12, 14, 16 and 18, and a rear arrangement of lands 11, 13, 15, 17, and 19. Together, the front and rear arrangements of lands form two (2) rows. In particular, the foregoing arrangement of land portions is such that the positions of adjacent lands 11–19 alternate or "zig-zag." According to the positions of lands 11–19, the positions of probes 21–29 also, as shown in the elevational drawing of FIG. 2(a), are arranged in two (2) rows. A front row includes probes 22, 24, 26, and 28. A rear row includes probes 21, 23, 25, 27 and 29. As such, the position of adjacent probes 21–29 alternate or zig-zag. More specifically, if one were to view probes 21–29 from a position which is relative to the contact surface of printed circuit board 10, one would see a zig-zig arrangement of probes. In this fashion, board space or "board real estate" is efficiently utilized while providing greater probe conductivity at the same or lower manufacturing costs of existing systems.

While the arrangements of land portions and probes shown in FIGS. 2(a) and 2(b) are such that two (2) rows are formed, the present invention is not so restricted. In fact, particular design criteria might call for a greater number or rows (e.g., three (3) or more) to which the present invention would be well suited.

Figure 3A:
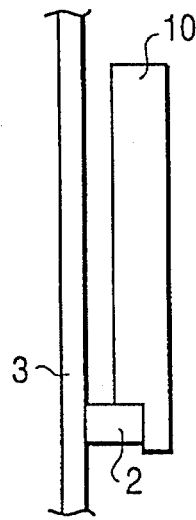
FIGS. 3(a) and 3(b) are respectively side and elevational views of the printed circuit board depicted in FIGS. 2(a) and (b).
Figure 3B:
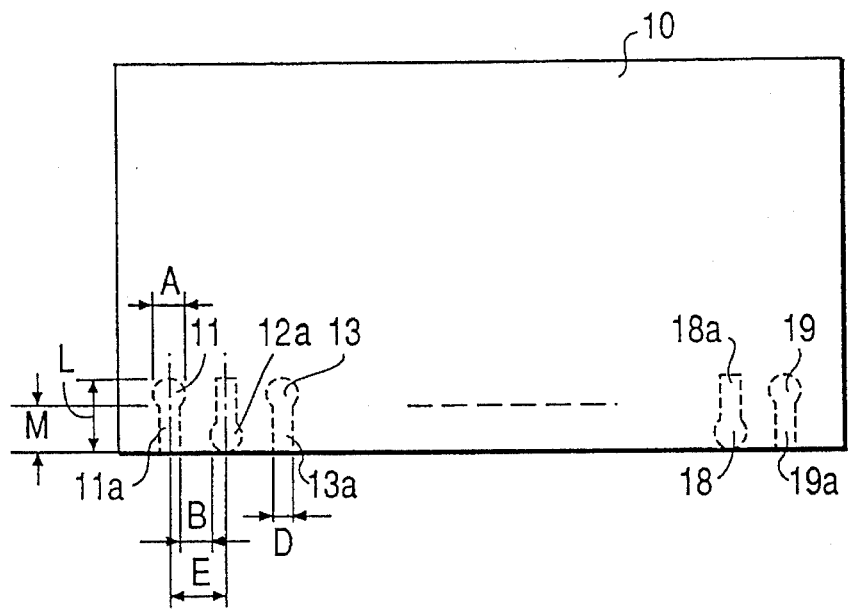

Referring now to FIGS. 3(a) and 3(b), therein depicted are side and elevational views of the printed circuit board depicted in FIGS. 2(a) and 2(b). In particular, FIGS. 3(a) and 3(b) show the state in which a connector 2, maintained on a printed circuit board 3, is connected to printed circuit board 10. More specifically, printed circuit board 10 is connected to the printed circuit board 3 via connector 2 to allow the transmission of electrical signals to occur between the two printed circuit boards. The height of connector 2 is M, and preferably is made less than the height of the circuit pattern portions 11a–19a, but may be made to be of any height as dictated by design parameters.

Land portions (not shown in the drawing) are also formed on the printed circuit board 3 in positions which are opposite to the circuit pattern portions 11a–19a so that dual contact among printed circuit board 3 and printed circuit board 10 can occur. The lands of printed circuit board 3 and the circuit pattern portions 11a–19a are connected via connector 2.

The space B is set to prevent short circuiting by the conductors or contact pins of connector 2, and the land width A is set to permit fluctuations of the positions of the probes 21–29 (not shown in FIGS. 3(a) or 3(b)). The land width D is set to permit fluctuation of the position of the lands of printed circuit board 10 and printed circuit board 3. Additionally, the land width A preferably is set to be greater than the land width D. The aforementioned dimensions are merely exemplary and are not meant to limit the scope of the present invention as defined by the appended claims. Moreover, the aforementioned dimensions may be changed and altered to suit particular design criteria.

The foregoing discussions of the structure depicted in FIGS. 3(a) and 3(b) indicate that by making the arrangement of land portions such that adjacent probes 21–29 alternate or zig-zag in position while maintaining the mutual interval C of the probes (see FIG. 2(b)), a reduction in the size of the probes 21–29 or an increase in their positioning precision is not necessary. In particular, because the land pitch E can be made narrow in comparison with the land pitch C of the prior art example shown in FIGS. 1(a) and 1(b), such reductions or increases are not necessary.

Figure 4A:
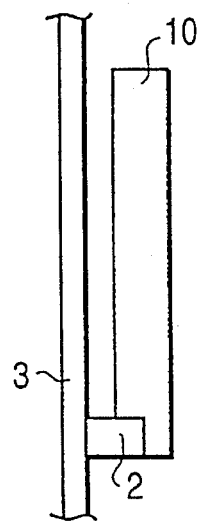
FIGS. 4(a) and 4(b) are respectively side and elevational views of a printed circuit board according to a second embodiment of the present invention.
Figure 4B:
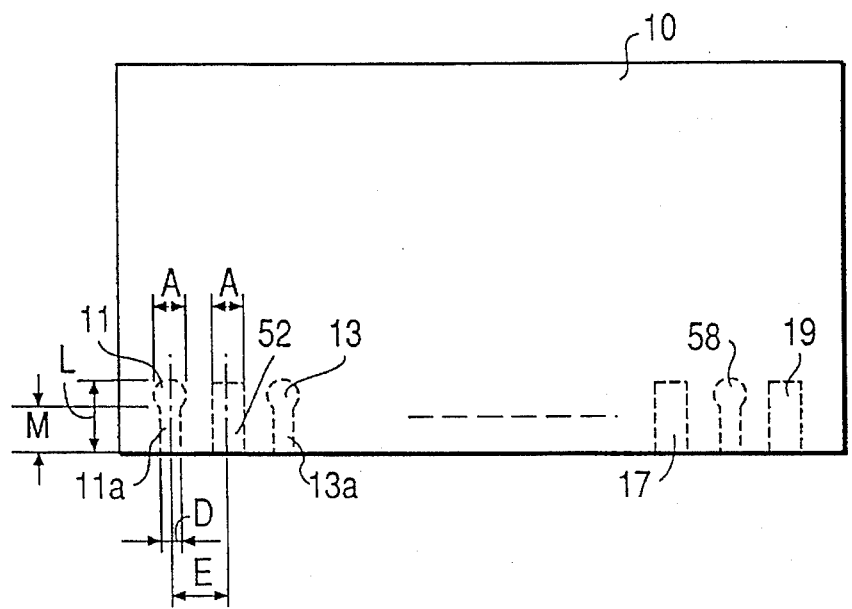

Referring now to FIGS. 4(a) and 4(b), therein depicted are side and elevational views of a printed circuit board according to a second embodiment of the present invention.

In particular, FIGS. 4(a) and 4(b) show the state in which, after the inspection of a printed circuit board 10 as shown in FIGS. 2(a) and 2(b), printed circuit board 10 is inserted in a camera device. In this embodiment, between lands 11–19, rectangularly shaped lands 52, 54, 56 and 58 are arranged instead of the lands 12–18. The width A of rectangular lands 52, 54, 56 and 58 is set in similar fashion to the land portions shown in FIGS. 2(a) and 1(b). Here, however, the arrangement of probes 21–29 (see FIG. 2(a) for an illustration of the probes) consists of two rows. In particular, a front row of probes can be configured to include probes 22, 24, 26, and 28, and a rear row of probes can be configured to include probes 21, 23, 25, 27, and 29. This configuration of printed circuit board 10 is such that seated or connected probes are arranged in alternating or zig-zag fashion.

With particular reference to FIG. 4(a), it will be understood that printed circuit board 10 is connected via connector 2 to printed circuit board 3. Additionally, transmission of electrical signals is performed between printed circuit board 10 and printed circuit board 3 through connector 2. The height of connector 2 is M, which is about the same height as that of the circuit pattern portions 11a–19a. Moreover, the height M of the connector 2 is arranged to be smaller than the total height L of land 11 and circuit pattern portion 11a. The above-mentioned dimensions are merely exemplary and are not meant to limit the scope of the present invention. Moreover, the actual dimensions which are chosen will vary depending upon design criteria.

The foregoing discussion of the second preferred embodiment depicted in FIGS. 4(a) and 4(b) illustrates that arranging the probes in an alternating or zig-zag fashion results in numerous advantages over prior known systems. In particular, a reduction in probe size is possible. Moreover, an increase in probe positional precision is not necessary in view of the teachings of the present invention. Finally, the total space required for lands 11–19 and the lands 52, 54, 56 and 58 is minimized, thus allowing for greater miniaturization.

It should be understood that lands portions also are formed on printed circuit board 3. These land portions are formed opposite to the circuit pattern portions 11a–19a and lands 52, 54, 56 and 58, and are connected to circuit pattern portions 11a–19a lands 52, 54, 56 and 58 via connector 2.

Figure 5:
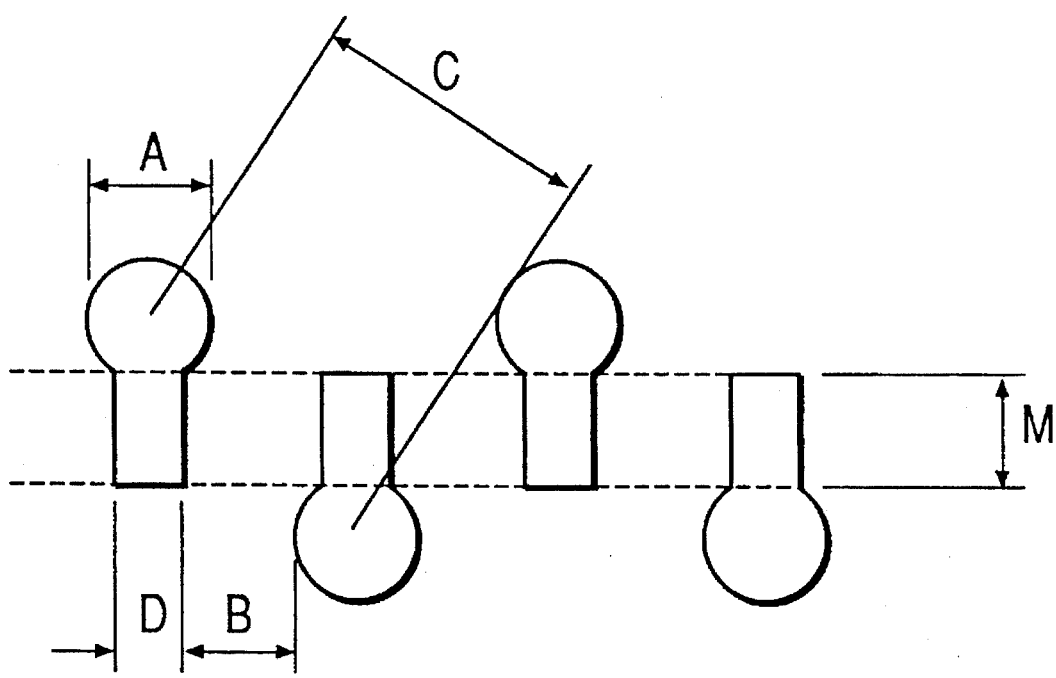
FIG. 5 is an elevational view of the land portions of a printed circuit board according to a third embodiment of the present invention.

Referring now to FIG. 5, therein depicted is an elevational view of the land portions of a printed circuit board according to a third embodiment of the present invention. In particular, the land portions are arranged in the form of two (2) rows. Additionally, as FIG. 5 illustrates, the position of any two adjacent land pattern portions alternate or zig-zag. In this manner, the interval between any two adjacent land portions is larger than the intervals depicted in FIGS. 2(a) and (b). Moreover, as a land connector connects only in the circular circuit pattern portion of a land portion, the land pitch (D+B) can be made quite narrow as opposed to the structure depicted in FIGS. 2(a) and (b). Additionally, A and D are respective land widths, B is the clearance between lands, and C is the probe position interval. As mentioned above, this embodiment may be configured to include more than two (2) rows of land portions.

The present invention as described above with reference to the drawing figures provides a printed circuit board having land pattern portions that are formed in two (2) or more rows. Additionally, because the position of adjacent land pattern portions alternate or zig-zag, probes or contact terminals may be made smaller. Moreover, the present invention allows for such probes to be manufactured without increasing their positional precision, thus resulting in decreased manufacturing costs. Finally, the present invention allows for the design of printed circuit boards which can realize a reduction in the amount of space needed for lands or contact points.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A printed circuit board comprising:
   a circuit pattern portion, said circuit pattern portion allowing transmission of electrical signals; and
   a plurality of land pattern portions, said plurality of land pattern portions allowing said circuit pattern portion to be electrically coupled to circuitry operatively coupled to said printed circuit board, and said plurality of land pattern portions being arranged in zig-zag fashion to form a plurality of rows disposed on said printed circuit board.

2. The printed circuit board according to claim 1, wherein said circuit pattern portion and said plurality of land pattern portions are formed on an end segment of said printed circuit board.

3. The printed circuit board according to claim 1, wherein said circuit pattern portion and said plurality of land pattern portions are centrally disposed on said printed circuit board.

* * * * *